United States Patent
Elkin et al.

(10) Patent No.: US 8,659,337 B2
(45) Date of Patent: Feb. 25, 2014

(54) LATCH CIRCUIT WITH A BRIDGING DEVICE

(75) Inventors: Ilyas Elkin, Sunnyvale, CA (US); William James Dally, Stanford, CA (US); Jonah M. Alben, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 11 days.

(21) Appl. No.: 13/188,364

(22) Filed: Jul. 21, 2011

(65) Prior Publication Data

US 2013/0021078 A1 Jan. 24, 2013

(51) Int. Cl.
*H03K 3/356* (2006.01)

(52) U.S. Cl.
USPC .......................... 327/208; 327/215; 327/219

(58) Field of Classification Search
USPC ......... 327/218, 208, 210, 211, 212, 214, 215, 327/219
See application file for complete search history.

(56) References Cited

U.S. PATENT DOCUMENTS

| | | | | |
|---|---|---|---|---|
| 5,103,116 A * | 4/1992 | Sivilotti et al. | ............... | 377/79 |
| 5,552,737 A * | 9/1996 | Chen | ............... | 327/202 |
| 5,821,791 A * | 10/1998 | Gaibotti et al. | ............... | 327/202 |
| 6,144,228 A * | 11/2000 | Matson et al. | ............... | 326/121 |
| 6,278,308 B1 * | 8/2001 | Partovi et al. | ............... | 327/218 |
| 6,977,528 B2 | 12/2005 | Kang et al. | | |
| 7,265,596 B2 | 9/2007 | Kang et al. | | |
| 7,479,806 B2 | 1/2009 | Teh et al. | | |
| 7,504,871 B2 * | 3/2009 | Kim et al. | ............... | 327/218 |

OTHER PUBLICATIONS

International Search Report, GB Application No. 1202866.8, dated Jun. 18, 2012.

* cited by examiner

*Primary Examiner* — Lincoln Donovan
*Assistant Examiner* — Jung H Kim
(74) *Attorney, Agent, or Firm* — Zilka-Kotab, PC

(57) ABSTRACT

One embodiment of the present invention sets forth a technique for capturing and holding a level of an input signal using a latch circuit that presents a low number of loads to the clock signal. The clock is only coupled to a bridging transistor and a pair of clock-activated pull-down or pull-up transistors. The level of the input signal is propagated to the output signal when the storage sub-circuit is not enabled. The storage sub-circuit is enabled by the bridging transistor and a propagation sub-circuit is activated and deactivated by the pair of clock-activated transistors.

12 Claims, 14 Drawing Sheets

PRIOR ART

PRIOR ART

LATCH CIRCUIT WITH A BRIDGING DEVICE

BACKGROUND OF THE INVENTION

1. Field of the Invention

The present invention generally relates to digital latch circuits and more specifically to a low-clock-energy latch circuit.

2. Description of the Related Art

Power dissipation is a significant problem in conventional integrated circuits. In many applications, the performance of integrated circuit devices is limited by the amount of energy consumed by the circuitry implementing a function rather than by the die area of the circuitry. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is a particularly important metric for determining the energy that is consumed by the latches and flip-flops. Hence reducing the clock-switched capacitance by a given amount produces 10-20× the power savings compared with reducing the data-switched capacitance by the same amount.

Conventional latches are often built as a pass-gate latch with tri-state feedback to produce a static circuit, as shown in FIG. 1A. Such a design requires a local clocked inverter (or two) to produce both polarities of the clock and has two clock loads on each of the pass gate and the feedback gate giving a total clock load of six or eight transistor devices.

FIG. 1B illustrates a conventional NOR latch 100 implemented with AND-OR-Invert (AOI) gates. The latch 100 is transparent when the clk (clock) input is high, so that the d input passes through to the q output. When the clk input is low the level of the d input is stored and q maintains the stored level of the d input at the q output. Each of the AND gates presents a clock load of two transistor gates, for a total clock load of four transistor devices.

FIG. 2A illustrates a latch circuit 200 corresponding to the conventional latch 100 shown in FIG. 1. The total clock load presented to Clk 220 is four transistor devices. The total number of transistors is sixteen, where each of inverters 222 and 224 include two transistors.

FIG. 2B illustrates a "push-pull" latch circuit 250 corresponding to conventional latch 100 shown in FIG. 1. The total clock load presented to an enable signal, E is four transistor devices. The total number of transistors is eleven, where each of the inverters includes two transistors. The PMOS transistors 256 and 258 are sized to be weak enough to allow D and dN to be written to S and sN when E is high, respectively. The weak devices are slow and do have a negative impact on the speed of the latch circuit 250. Specifically, the PMOS transistors 256 and 258 should be weak enough to be are overpowered by one of the two NMOS pull down stacks formed by NMOS transistor 260 and the NMOS transistor of inverter 262 or NMOS transistors 264 and 266. However, the PMOS transistors 256 and 258 are should be strong enough to pull up S or sN. These conflicting demands are difficult to balance, particularly as the fabrication process varies.

Accordingly, what is needed in the art is a latch circuit that reduces the clock energy by reducing the capacitance of clock loads. Additionally, the latch circuit should function independent of fabrication process variations.

SUMMARY OF THE INVENTION

One embodiment of the present invention sets forth a technique for capturing and holding a level of an input signal using a low-clock-energy latch circuit. The clock is only coupled to a pair of clock-activated pull-up (or pull-down) transistors and a bridging transistor. The level of the input signal is captured by a storage sub-circuit on one of the high or the low clock phase and stored to generate an output signal on the complement phase. The level of the input signal is propagated to the output signal when the storage sub-circuit is not enabled. The storage sub-circuit is enabled by the bridging transistor and a propagation sub-circuit is activated and deactivated by a pair of clock-activated transistors.

Various embodiments of the invention comprise a low-clock-energy latch circuit that includes a bridging transistor, storage sub-circuit, and a propagation sub-circuit. The storage sub-circuit is configured to propagate an input signal to generate an output signal while a clock signal is high, capture a level of the input signal when the clock signal transitions from high to low and hold the level to generate the output signal while the clock signal is low. The bridging transistor is configured to enable a path between the storage sub-circuit and a power supply. The propagation sub-circuit is configured to receive the input signal and propagate the level of the input signal to generate the output signal while the clock signal is high, where at least one pull-down transistor activates the propagation sub-circuit when the clock signal is high and deactivates the propagation sub-circuit when the clock signal is low.

One advantage of the disclosed latch circuit is that the transistor device load on the clock signal is reduced to only two or three transistor gates. Therefore, the clock energy is reduced significantly compared with latch circuit having greater loads on the clock signal. Versions of the latch circuit with the bridging transistor activated by a clock (or enable signal) are also completely static and do not rely on sizing relationships between the different transistors. Versions of the latch circuit that use a weak always-on bridging device present only two loads to the clock (or enable signal). The latch circuit operations are robust, even when the characteristics of the transistors vary due to the fabrication process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
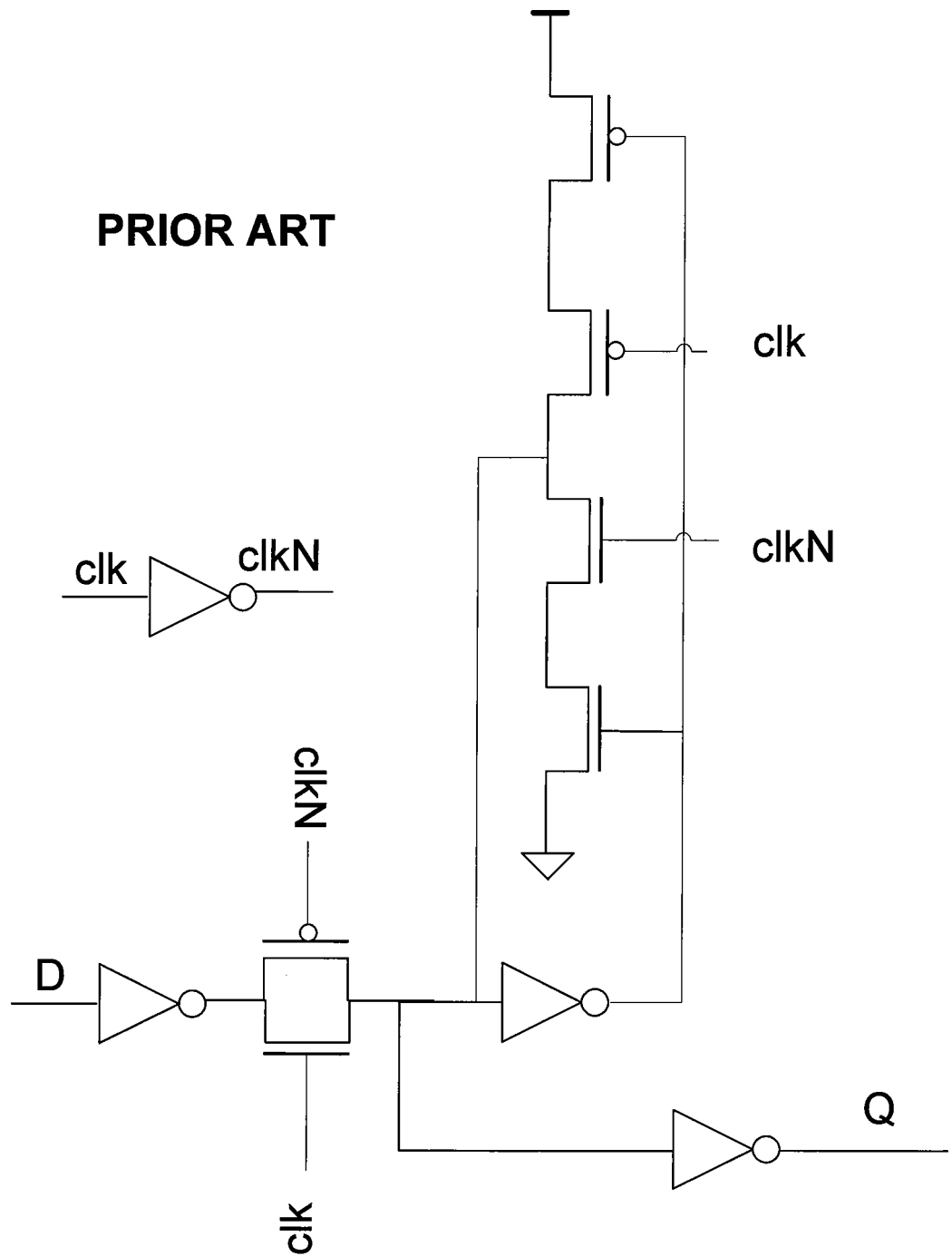
FIGS. 1A and 1B illustrate conventional latches, according to the prior art.
Figure 1B:
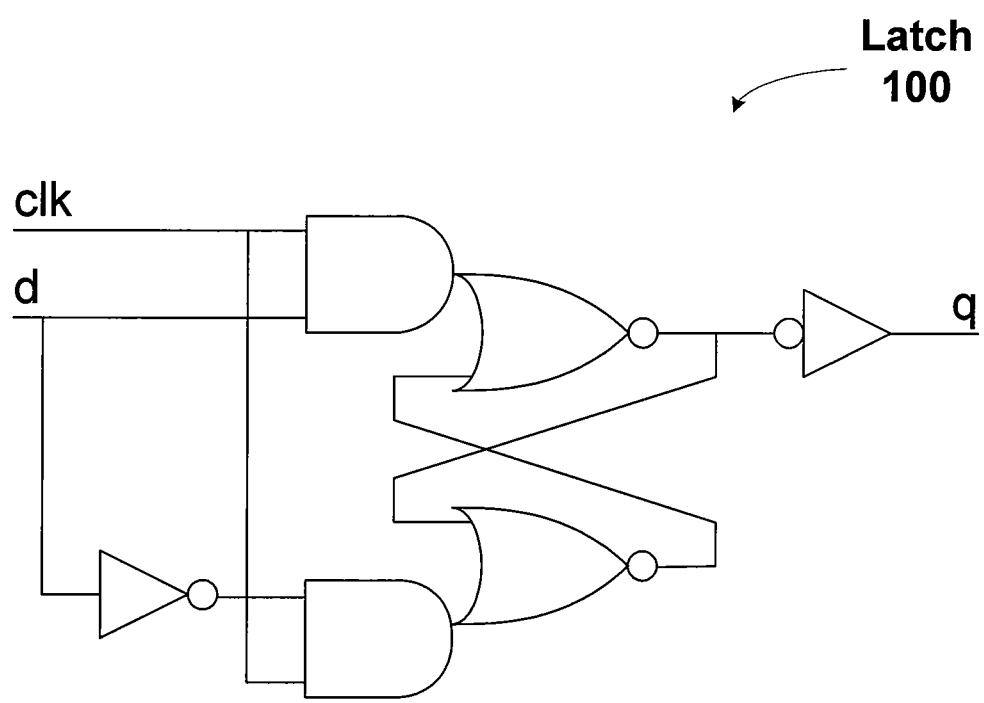
Figure 2A:
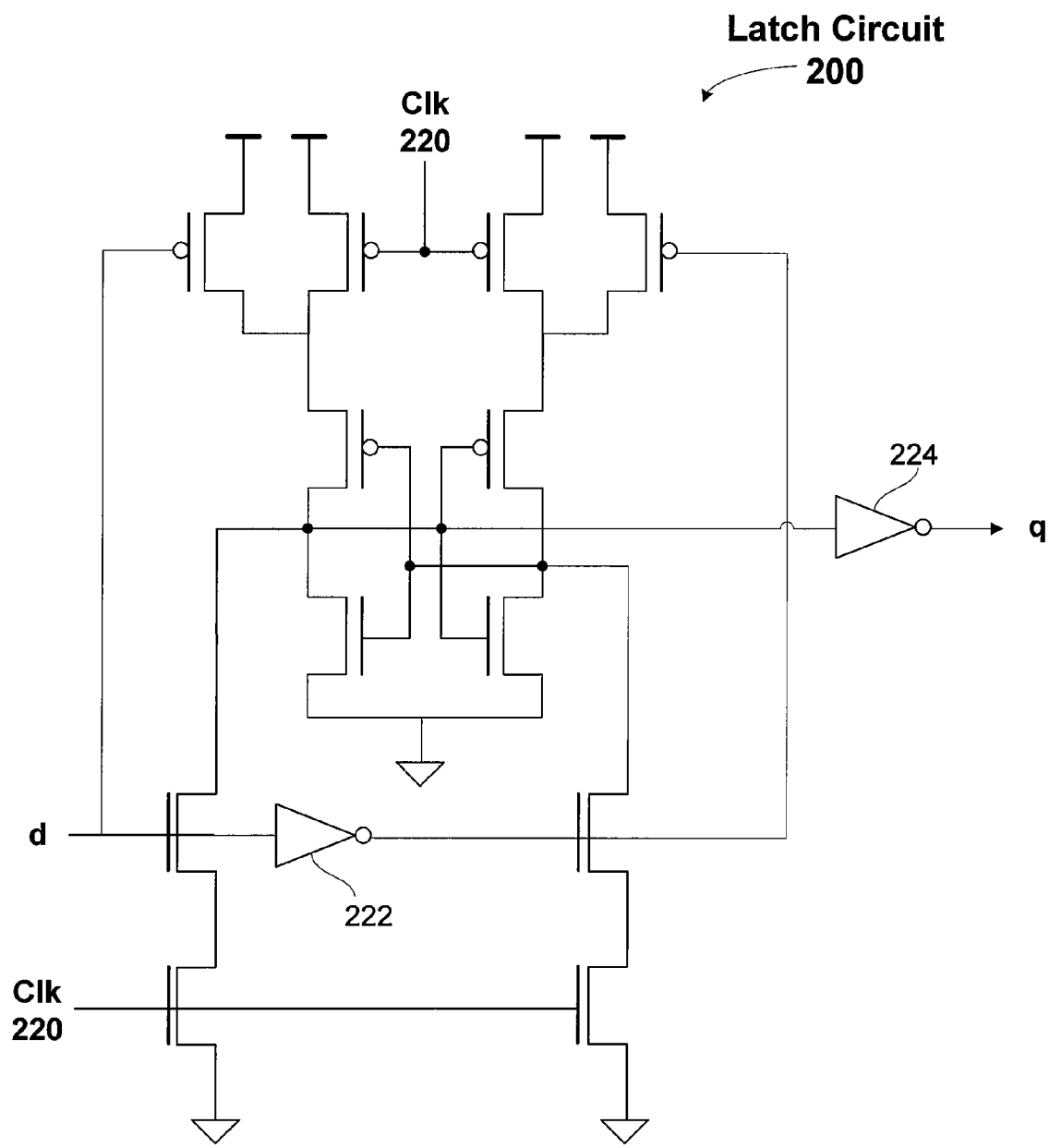
FIG. 2A illustrates a circuit corresponding to the conventional latch shown in FIG. 1, according to the prior art.
Figure 2B:
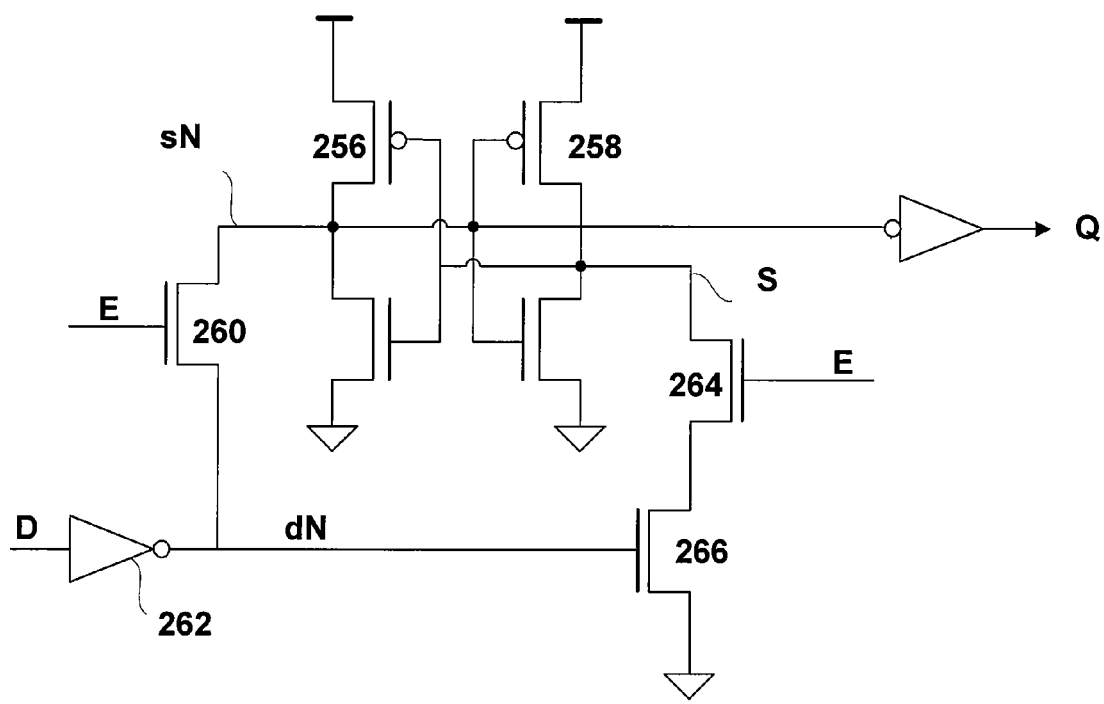
FIG. 2B illustrates a "push-pull" latch circuit corresponding to conventional latch 100 shown in FIG. 1, according to the prior art.
Figure 3A:
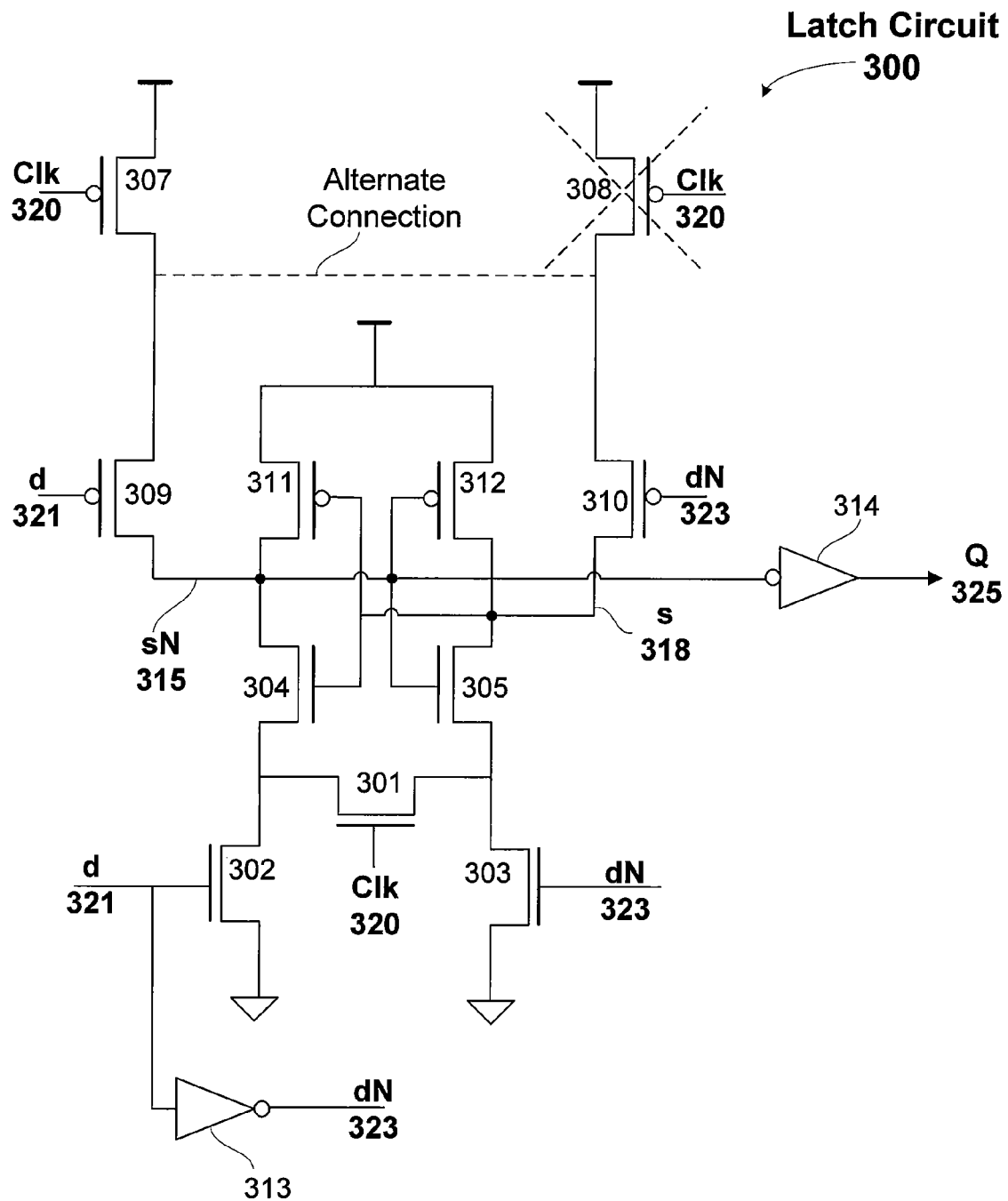
FIG. 3A illustrates a low-clock-energy latch circuit that is transparent when the clock signal is low, according to one embodiment of the invention.

FIG. 3A illustrates a low-clock-energy latch circuit 300 that is transparent when the clock signal, Clk 320 is low, according to one embodiment of the invention. The latch circuit 300 is a fully-static, clock-energy-efficient latch that presents only three loads to the clock and which does not depend on transistor device size ratios. With only three minimum sized clock loads, the latch circuit 300 should consume only a third of the clock energy that is consumed by a conventional pass-gate latch (dependent on transistor sizing). The total number of transistors included in the latch circuit 300 is fifteen, where each of inverters 313 and 314 include two transistors. Compared with the latch circuit 200, having the sixteen transistors, the loads on the clock are reduced from four to three.

As shown in FIG. 3A transistors 301, 302, 303, 304, and 305 are NMOS devices and transistors 307, 308, 309, 310, 311, and 312 are PMOS devices. Transistors 304, 305, 311, and 312 are configured as cross-coupled inverters that are enabled by pull-down transistors 302 and 303 to form a storage sub-circuit. A first inverter includes transistors 311 and 304 and a second inverter includes transistors 312 and 305. The transistor 301 is a clock-enabled bridging transistor that is configured to enable the storage sub-circuit by allowing current to flow through either transistor 304 or 305 to ground when the clock is high, i.e., during the high phase of the clock 320. The bridging transistor 301 is configured to enable a path between the storage sub-circuit and ground. Importantly, the connection to ground is provided by either transistor 302 or 303 because one (and only one) of transistors 302 and 303 is enabled at a time. The transistor 301 is shared between both inverters of the storage sub-circuit. Transistors 302, 303, 307, 308, 309, 310, and inverter 313 that generates dN 323 form propagation circuitry that passes the input signal d 321 to the output signal Q 325. The inverter 314 isolates Q 325 from the storage feedback loop of the storage sub-circuit. In the event that setup timing is not critical, synchronization performance is not important, and the load on the output Q 325 is low and static, inverter 314 may be omitted.

The transistors 307 and 308 are clock-enabled pull-up transistors that are configured to activate the propagation circuitry to pass the input signal d 321 through to the output signal Q 325 when the clk 320 is low, i.e., during the low phase of the clock 320. Transistor 301 and transistors 307 and 308 are opposite polarities so that either the storage sub-circuit is enabled or the propagation circuitry is active, respectively, in order to produce a fully-static circuit. Transistors 307 and 309 are configured as a pull-up stack to pull up node sN 315 and drive the input of the inverter formed by transistors 312 and 305. Similarly, transistors 308 and 310 are configured as a pull-up stack to pull up node s 318 and drive the input of the inverter formed by transistors 311 and 304. The order of the transistors in each pull-up stack may be swapped without changing the function of the latch circuit 300.

When the clk 320 is low either transistors 309 and 303 are enabled or transistors 310 and 302 are enabled to drive the complement of input signal d 321 onto storage node sN 315 or to drive the input signal d 321 onto storage node s 318, respectively. Importantly, when the clock 320 is low the clock-enabled bridging transistor 301 is disabled and only one of the inverters formed by transistors 311 and 304 or transistors 312 and 305 has a pull-down path enabled. Consequently, the transistors driving the storage nodes sN 315 and s 318 do not need to overpower an opposing pull-down device and the storage nodes sN 315 and s 318 are easily written.

While the clk 320 is low, the output signal Q 325 will follow the level of input signal d 321. When the clk 320 rises, the storage sub-circuit captures the level of input signal d 321 and holds the level to generate the output signal Q 325 while the clk 320 is high. While the clk 320 is high, the pull-up stacks within the propagation sub-circuit (transistors 307 and 309 and transistors 308 and 310) have no effect on the output signal Q 325. Importantly, because transistor 301 and either transistor 302 or 303 are activated when the clock 320 is high, diffusions on transistors 304 and 305 are connected together and to ground, a cross-coupled inverter is formed by transistors 311, 304, 312 and 305 that holds the values on S 318 and sN 315. Transistors 302 and 303 are included in the storage sub-circuit and in the propagation sub-circuit.

As shown by the alternate connection in FIG. 3A, a single clock-enabled pull-up transistor 307 may be used in the latch circuit 300. Although FIG. 3A shows that transistor 308 is removed when the alternate connection is used, another option is to remove transistor 307 and use transistor 308 as the single clock-enabled pull-up transistor. However, in either case, the operation would not necessarily be robust due to overlaps in signals d 321 and dN 323, causing both d 321 and dN 323 to below during transitions of signal d 321. During these overlaps, s 318 and/or sN 315 may be inadvertently pulled high while the clock 320 is low. Careful sizing of the transistors in the latch circuit 300 is needed for reliable operation when only a single clock-enabled pull-up transistor is used.

Figure 3B:
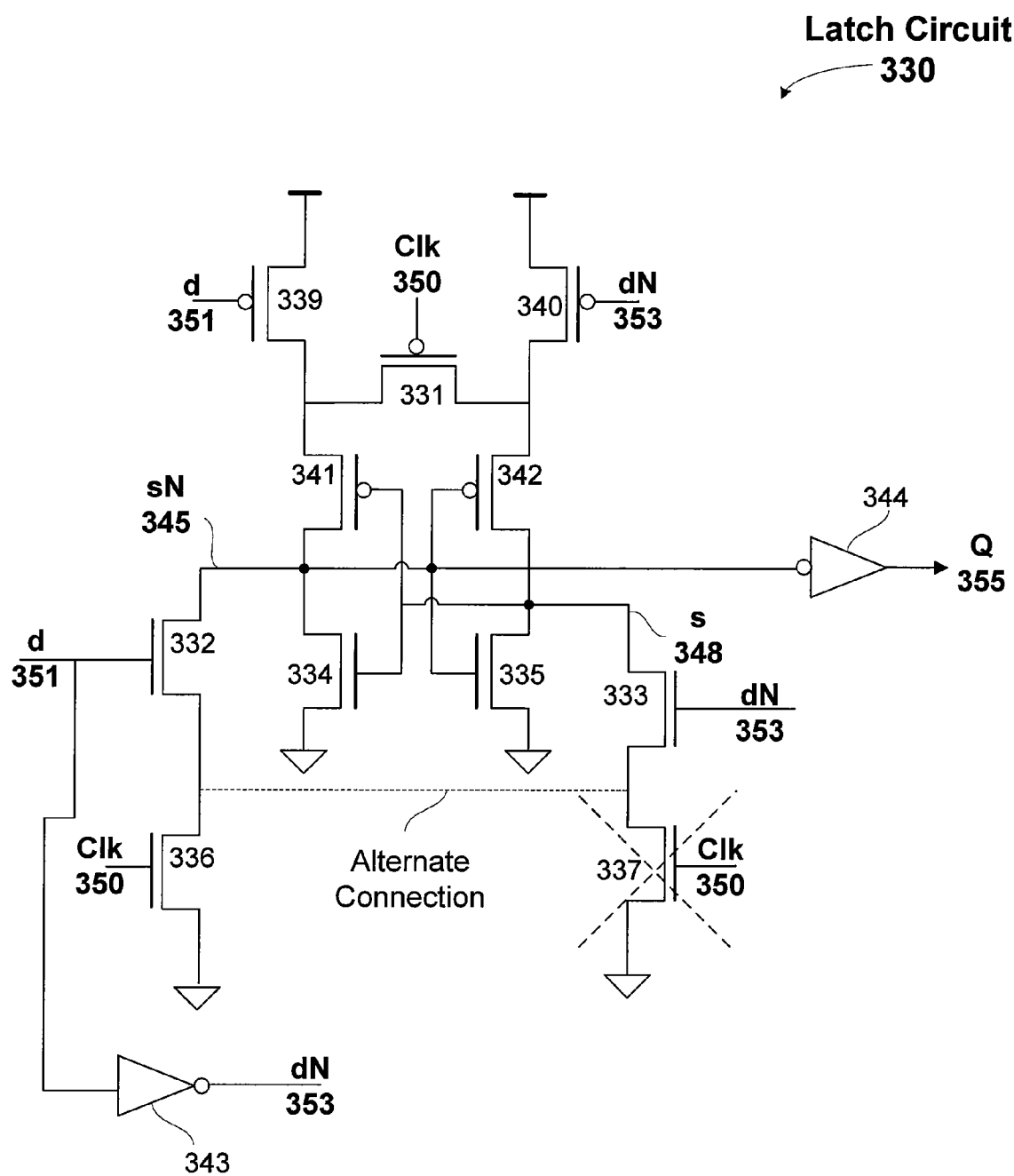
FIG. 3B illustrates a low-clock-energy latch circuit that is transparent when the clock signal is high, in accordance with one or more aspects of the present invention.

FIG. 3B illustrates a low-clock-energy latch circuit 330 that is transparent when the clock signal, Clk 350 is high, in accordance with one or more aspects of the present invention. Like the latch circuit 300, the latch circuit 350 is also a fully-static, energy-efficient latch that presents only three loads to the clock and which does not depend on transistor device size ratios. With only three minimum sized clock loads, the latch circuit 350 should consume only a third of the clock energy that is consumed by a conventional pass-gate latch (dependent on transistor sizing). The total number of transistors included in the latch circuit 350 is fifteen, where each of inverters 343 and 344 include two transistors. Compared with the latch circuit 200 having sixteen transistors, the loads on the clock signal are reduced from four to three.

As shown in FIG. 3B transistors 332, 333, 334, 335, 336, and 337 are NMOS devices and transistors 331, 339, 340, 341, and 342 are PMOS devices. Transistors 334, 341, 335, and 342 are configured as cross-coupled inverters that are enabled by pull-up transistors 339 and 340 to form a storage sub-circuit. A first inverter includes transistors 341 and 334 and a second inverter includes transistors 342 and 335. The transistor 331 is an enabled bridging transistor that is configured to enable the storage sub-circuit when clock signal, Clk 350 is low, by allowing current to flow from the supply voltage through either transistor 339 or 340 when Clk 350 is low. The bridging transistor 331 is configured to enable a path between the storage sub-circuit and the supply voltage. Importantly, the connection to the supply voltage is provided by either transistor 339 or 340 because one (and only one) of transistors 339 and 340 is enabled at a time. The transistor 331 is shared between both inverters of the storage sub-circuit. Transistors 332, 333, 336, 337, 339, 340, and inverter 343 that generates dN 353 form propagation circuitry that passes the input signal d 351 to the output signal Q 355. The inverter 344 isolates Q 355 from the storage feedback loop of the storage sub-circuit. In the event that setup timing is not critical, synchronization performance is not important, and the load on the output Q 355 is low and static, inverter 344 may be omitted.

The transistors 336 and 337 are enabled pull-down transistors that are configured to activate the propagation circuitry to pass the input signal d 351 through to the output signal Q 355 when the Clk 350 is high. Note that Clk 350 may be replaced with an enable signal. Transistor 331 is the opposite polarity compared with transistors 336 and 337 so that either the storage sub-circuit is enabled or the propagation circuitry is active, respectively, in order to produce a fully-static circuit. Transistors 332 and 336 are configured as a pull-down stack to pull down node sN 345 and drive the input of the inverter formed by transistors 335 and 342. Similarly, transistors 333 and 337 are configured as a pull-down stack to pull down node s 348 and drive the input of the inverter formed by transistors 341 and 334. The order of the transistors in each pull-up stack may be swapped without changing the function of the latch circuit 330.

When the Clk 350 is high either transistors 332 and 340 are enabled or transistors 339 and 333 are enabled to drive the complement of input signal d 351 onto storage node sN 345 or to drive the input signal d 351 onto storage node s 348, respectively. Importantly, when the Clk 350 is high the enabled bridging transistor 331 is disabled and only one of the inverters formed by transistors 341 and 334 or transistors 342 and 335 has a pull-up path enabled. Consequently, the transistors driving the storage nodes sN 345 and s 348 do not need to overpower an opposing pull-up device and the storage nodes sN 345 and s 348 are easily written.

While the Clk 350 is high, the output signal Q 355 will follow the level of input signal d 351. When the Clk 350 falls, the storage sub-circuit captures the level of input signal d 351 and holds the level to generate the output signal Q 355 while the Clk 350 is low. While the Clk 350 is low, the pull-down stacks within the propagation sub-circuit (transistors 332 and 336 and transistors 333 and 337) have no effect on the output signal Q 355. Importantly, because transistor 331 and either transistor 339 or 340 are activated when the clock 350 is low, diffusions on transistors 341 and 342 are connected together and to ground, a cross-coupled inverter is formed by transistors 334, 341, 335 and 342 that holds the values on S 348 and sN 345. Transistors 339 and 340 are included in the storage sub-circuit and in the propagation sub-circuit.

As shown by the alternate connection in FIG. 3B, a single clock-enabled pull-down transistor 307 may be used in the latch circuit 330. Although FIG. 3A shows that transistor 337 is removed when the alternate connection is used, another option is to remove transistor 336 and use transistor 337 as the single clock-enabled pull-down transistor. However, in either case, the operation would not necessarily be robust due to overlaps in signals d 351 and dN 353, causing both signals d 351 and dN 353 to be high during transitions of signal d 351. During these overlaps, s 348 and/or sN 345 may be inadvertently pulled low while the clk 350 is high. Careful sizing of the transistors in the latch circuit 330 is needed for reliable operation when only a single enabled pull-down transistor is used.

Figure 3C:
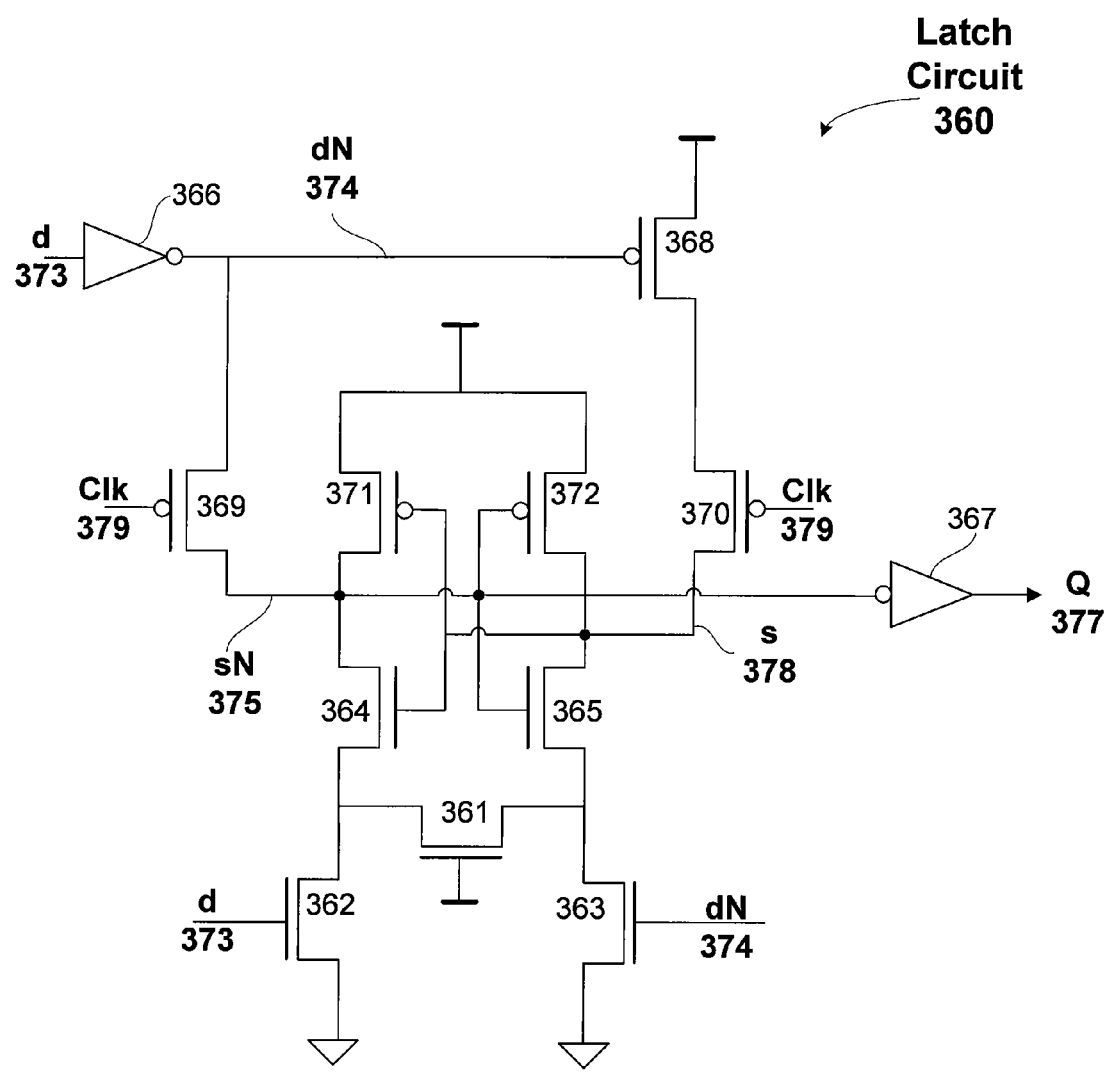
FIG. 3C illustrates another low-clock-energy latch circuit that is transparent when the clock signal is low, according to one embodiment of the invention.

FIG. 3C illustrates another low-clock-energy latch circuit 360 that is transparent when the clock signal, Clk 379 is low, according to one embodiment of the invention. The latch circuit 360 is a clock-energy-efficient latch that presents only two loads to the clock and which does not depend on transistor device size ratios. With only two minimum sized clock loads, the latch circuit 360 should consume only a quarter of the clock energy that is consumed by a conventional pass-gate latch. The total number of transistors included in the latch circuit 360 is fourteen, where each of inverters 366 and 367 include two transistors. Compared with the latch circuit 200, having the sixteen transistors, the loads on the clock are reduced from four to two.

The latch circuit 360 is similar to the latch circuit 300, except that the clock-enabled bridging transistor is not clock-enabled, the inputs to the gates of the transistors in the pull-up stacks are swapped, and transistor 309 is replaced with an inverter 366. Instead the bridging transistor 361 is a weak device that is always enabled. Because transistor 361 is weak, the transistors driving the storage nodes sN 375 and s 378 do not need to overpower a strong opposing pull-down device and the storage nodes sN 375 and s 378 are easily written. Compared with the latch circuit 250 of the prior art, the write operation for the latch circuit 360 does not have to overpower opposing transistors. The bridging transistor 361 may be sized weak enough to allow writing without negatively impacting pull-up speed (the pull-up operation does not involve the bridging transistor 361).

As shown in FIG. 3C transistors 361, 362, 363, 364, and 365 are NMOS devices and transistors 368, 369, 370, 371, and 372 are PMOS devices. Transistors 364, 365, 371, and 372 are configured as cross-coupled inverters that are enabled by pull-down transistors 362 and 363 to form a storage sub-circuit. A first inverter includes transistors 371 and 364 and a second inverter includes transistors 372 and 365. The transistor 361 is a weak bridging transistor that is configured to allow current to flow through either transistor 362 or 363 to ground. The bridging transistor 361 is configured to enable a path between the storage sub-circuit and ground. The connection to ground is provided by either transistor 362 or 363 because one (and only one) of transistors 362 or 363 is enabled at a time. The transistor 361 is shared between both inverters of the storage sub-circuit. Transistors 362, 363, 368, 369, 370, and inverter 366 that generates dN 374 form propagation circuitry that passes the input signal d 373 to the output signal Q 377. The inverter 367 isolates Q 377 from the storage feedback loop of the storage sub-circuit. In the event that setup timing is not critical, synchronization performance is not important, and the load on the output Q 377 is low and static, inverter 367 may be omitted.

The transistors 369 and 370 are clock-enabled pull-up transistors that are configured to activate the propagation circuitry to pass the input signal d 373 through to the output signal Q 377 when the clk 379 is low. The pull-up transistor of inverter 366 and transistor 369 are configured as a pull-up stack to pull up node sN 375 and drive the input of the inverter formed by transistors 372 and 365. Similarly, transistors 368 and 370 are configured as a pull-up stack to pull up node s 378 and drive the input of the inverter formed by transistors 371 and 364.

When the clk 379 is low either the pull-up transistor of inverter 366 and transistor 363 are enabled or transistors 368 and 362 are enabled to drive the complement of input signal d 373 onto storage node sN 375 or to drive the input signal d 373 onto storage node s 378, respectively. While the clk 379 is low, the output signal Q 377 will follow the level of input signal d 373. When the clk 379 rises, the storage sub-circuit captures the level of input signal d 373 and holds the level to generate the output signal Q 377 while the clk 379 is high. While the clk 379 is high, the pull-up stacks within the propagation sub-circuit (the pull-up transistor of inverter 366 and transistor 369 and transistors 368 and 370) have no effect on the output signal Q 377. Transistors 362 and 363 are included in the storage sub-circuit and in the propagation sub-circuit.

Figure 3D:
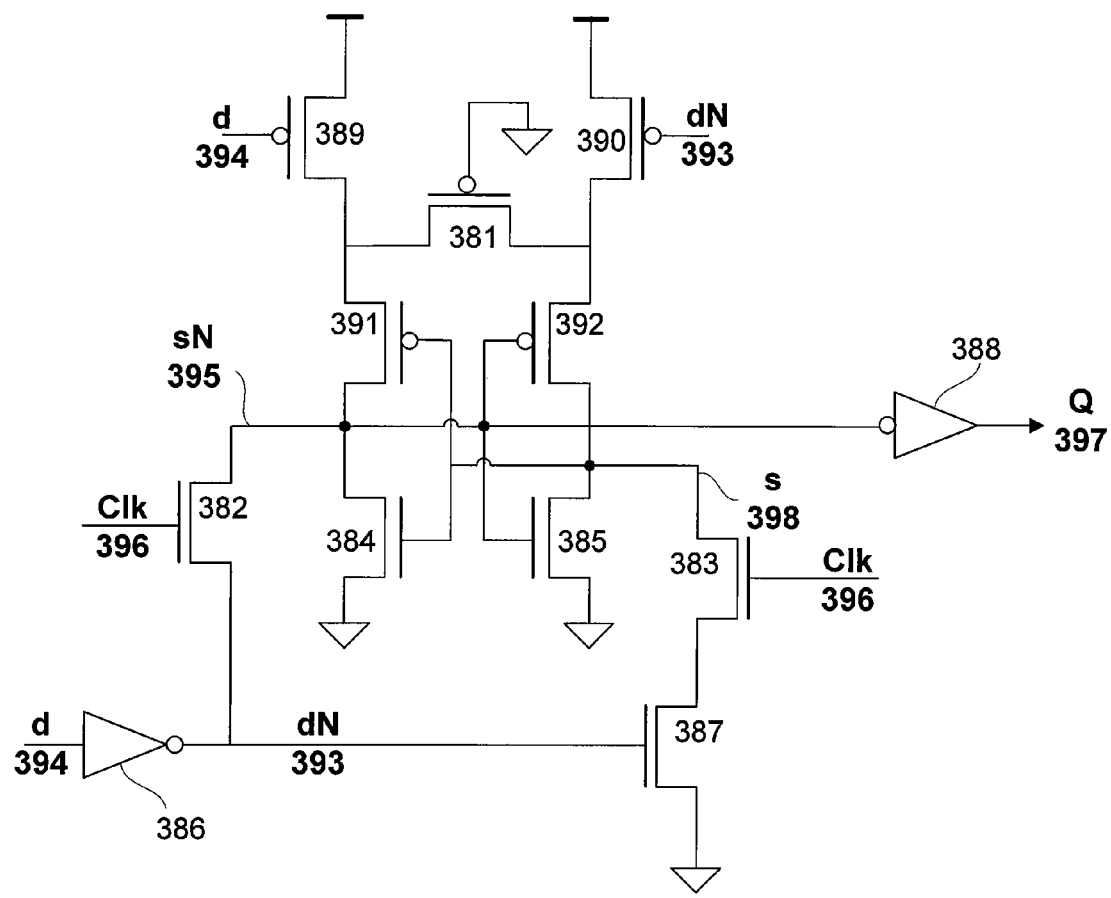
FIG. 3D illustrates another low-clock-energy latch circuit that is transparent when the clock signal is high, in accordance with one or more aspects of the present invention.

FIG. 3D illustrates another low-clock-energy latch circuit 380 that is transparent when the clock signal, Clk 396 is high, in accordance with one or more aspects of the present invention. The latch circuit 380 is an energy-efficient latch that presents only two loads to the clock and which does not depend on transistor device size ratios. With only two minimum sized enable loads, the latch circuit 380 should consume only a fourth of the clock energy that is consumed by a conventional pass-gate latch. The total number of transistors included in the latch circuit 380 is fourteen, where each of inverters 386 and 388 include two transistors. Compared with the latch circuit 200 having sixteen transistors, the loads on the clock signal are reduced from four to two.

The latch circuit 380 is similar to the latch circuit 330, except that the clock-enabled bridging transistor is not clock-enabled, the inputs to the gates of the transistors in the pull-down stacks are swapped, and transistor 332 is replaced with an inverter 394. The bridging transistor 381 is a weak device that is always enabled. Because transistor 381 is weak, the transistors driving the storage nodes sN 395 and s 398 do not need to overpower a strong opposing pull-up device and the storage nodes sN 395 and s 398 are easily written. Compared with the latch circuit 250 of the prior art, the write operation for the latch circuit 380 does not have to overpower opposing transistors. The bridging transistor 381 may be sized weak enough to allow writing without negatively impacting pull-down speed (the pull-down operation does not involve the bridging transistor 381).

As shown in FIG. 3D transistors 382, 383, 384, 385, and 387 are NMOS devices and transistors 381, 389, 390, 391, and 392 are PMOS devices. Transistors 384, 391, 385, and 392 are configured as cross-coupled inverters that are enabled by pull-up transistors 389 and 390 to form a storage sub-circuit. A first inverter includes transistors 391 and 384 and a second inverter includes transistors 392 and 385. The transistor 381 is configured to enable the storage sub-circuit by allowing current to flow from the supply voltage through either transistor 389 or 390 when Clk 396 is low. The bridging transistor 381 is configured to enable a path between the storage sub-circuit and the supply voltage. Importantly, the connection to the supply voltage is provided by either transistor 389 or 390 because one (and only one) of transistors 389 and 390 is enabled at a time. The transistor 381 is shared between both inverters of the storage sub-circuit. Transistors 382, 383, 387, 389, 390, and inverter 394 that generates dN 393 form propagation circuitry that passes the input signal d 394 to the output signal Q 397. The inverter 388 isolates Q 397 from the storage feedback loop of the storage sub-circuit. In the event that setup timing is not critical, synchronization performance is not important, and the load on the output Q 397 is low and static, inverter 388 may be omitted.

The transistors 382 and 383 are enabled pull-down transistors that are configured to activate the propagation circuitry to pass the input signal d 394 through to the output signal Q 397 when the Clk 396 is high. Note that Clk 396 may be replaced with a clock signal, such as Clk 320 or 379. Transistors 382 and the pull-down transistor of the inverter 386 are configured as a pull-down stack to pull down node sN 395 and drive the input of the inverter formed by transistors 385 and 392. Similarly, transistors 383 and 387 are configured as a pull-down stack to pull down node s 398 and drive the input of the inverter formed by transistors 391 and 384.

When the Clk 396 is high either the pull-down transistor of the inverter 386 and transistor 390 are enabled or transistors 389 and 387 are enabled to drive the complement of input signal d 394 onto storage node sN 395 or to drive the input signal d 394 onto storage node s 398, respectively.

While the Clk 396 is high, the output signal Q 397 will follow the level of input signal d 394. When the Clk 396 falls, the storage sub-circuit captures the level of input signal d 394 and holds the level to generate the output signal Q 397 while the Clk 396 is low. While the Clk 396 is low, the pull-down stacks within the propagation sub-circuit have no effect on the output signal Q 397. Transistors 389 and 390 are included in the storage sub-circuit and in the propagation sub-circuit.

Figure 4A:
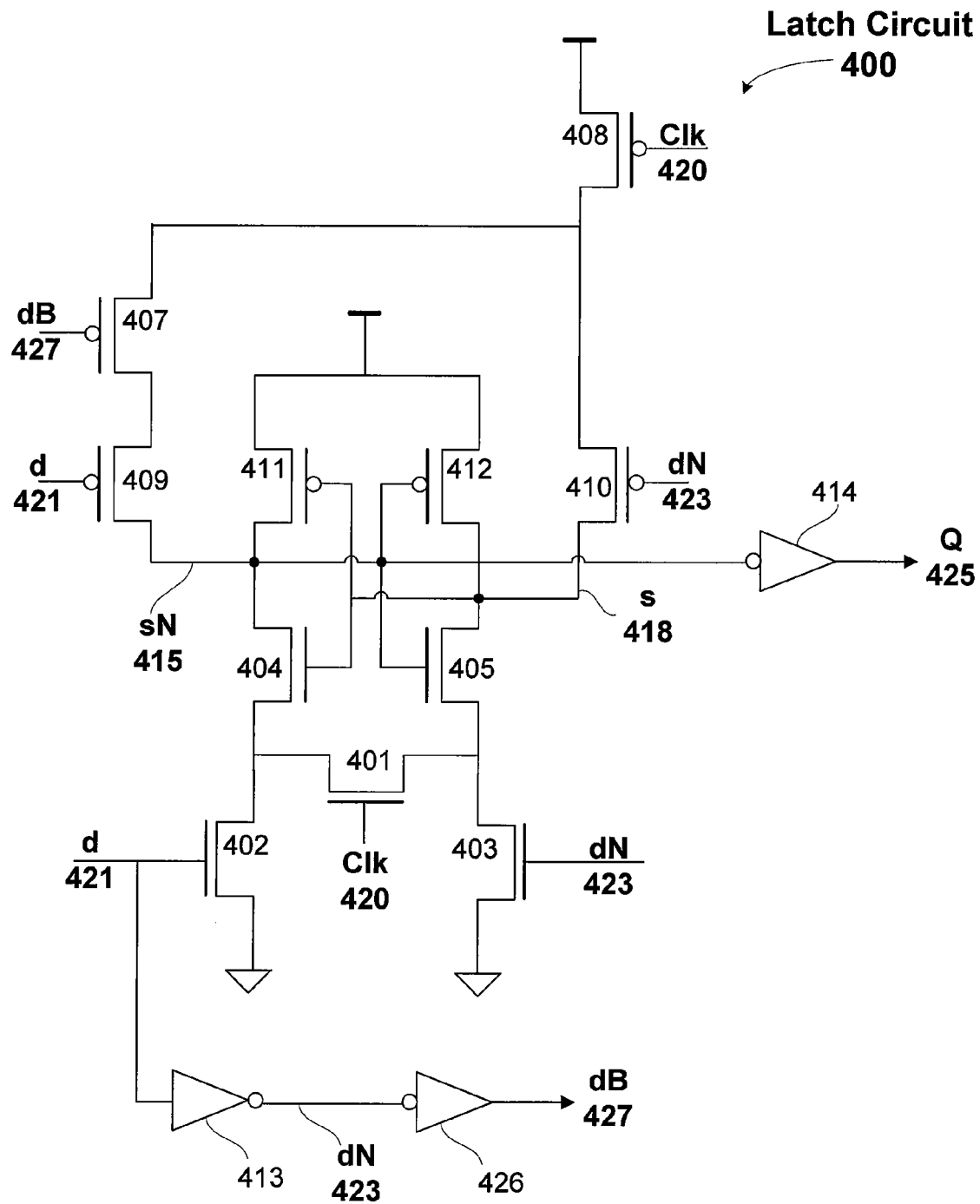
FIG. 4A illustrates another low-clock-energy latch circuit that is transparent when the clock signal is low, according to one embodiment of the invention.

FIG. 4A illustrates a low-clock-energy latch circuit 400 that is transparent when the clock signal, during the low phase of Clk 420, according to one embodiment of the invention. The latch circuit 400 is a clock-energy-efficient latch that presents only two loads to the clock. With only two minimum sized clock loads, the latch circuit 400 should consume only a quarter of the clock energy that is consumed by a conventional pass-gate latch. The total number of transistors included in the latch circuit 400 is seventeen, where each of inverters 413, 426, and 414 include two transistors. Compared with the latch circuit 400, also having the sixteen transistors, the loads on the clock are reduced from four to two.

The latch circuit 400 is similar to the latch circuit 300 except that only a single clock-enabled pull-up transistor 408 is used in the latch circuit 400. As previously described, a single clock-enabled pull-up transistor may also be used in the latch circuit 300, but the operation would not necessarily be robust due to overlaps in signals d 321 and dN 323, causing both d 321 and dN 323 to be low during transitions of signal d 321. During these overlaps, s 318 and/or sN 315 may be inadvertently pulled high while the clock 320 is low. Careful sizing of the transistors in the latch circuit 300 is needed for reliable operation when only a single clock-enabled pull-up transistor is used.

To avoid inadvertently pulling up s 418 and/or sN 415 when d 421 transitions and the clock 420 is low, the pull-up stack formed by transistors 408, 407, and 409 is activated when both d 421 and a delayed version of d 421, dB 327 are both low. The serial coupling of transistors 407 and 409 ensures robust operation while only burdening the clock 420 with two loads. The arrangement ensures a break-before-make operation when input d changes. On a rising transition of d transistor 409 turns off before transistor 410 turns on. On a falling transition of d transistor 410 turns off before 407 turns on.

This avoids any overlap in conduction between the pull-up path connected to sN (transistors 407 and 409) and the pull-up path connected to s (transistor 410).

As shown in FIG. 4A transistors 401, 402, 403, 404, and 405 are NMOS devices and transistors 407, 408, 409, 410, 411, and 412 are PMOS devices. Transistors 404, 405, 411, and 412 are configured as cross-coupled inverters that are enabled by pull-down transistors 402 and 403 to form a storage sub-circuit. A first inverter includes transistors 411 and 404 and a second inverter includes transistors 412 and 405. The transistor 401 is a clock-enabled bridging transistor that is configured to enable the storage sub-circuit by allowing current to flow through either transistor 404 or 405 to ground when the clock is high. The bridging transistor 401 is configured to enable a path between the storage sub-circuit and ground. Importantly, the connection to ground is provided by either transistor 402 or 403 because one (and only one) of transistors 402 and 403 is enabled at a time. The transistor 401 is shared between both inverters of the storage sub-circuit. Alternatively, the bridging transistor 401 may be configured as an always-on weak device (similar to transistor 301 as shown in FIG. 3C).

Transistors 402, 403, 407, 408, 409, 410, and inverters 413 and 426 that generate dN 423 and dB 427, respectively, form propagation circuitry that passes the input signal d 421 to the output signal Q 425. The inverter 414 isolates Q 425 from the storage feedback loop of the storage sub-circuit. In the event that setup timing is not critical, synchronization performance is not important, and the load on the output Q 425 is low and static, inverter 414 may be omitted.

The transistor 408 is a clock-enabled pull-up transistor that is configured to activate the propagation circuitry to pass the input signal d 421 through to the output signal Q 425 when the clk 420 is low. Transistor 401 and transistor 408 are opposite polarities so that either the storage sub-circuit is enabled or the propagation circuitry is active, respectively, in order to produce a fully-static circuit. Transistors 408, 407, and 409 are configured as a pull-up stack to pull up node sN 415 and drive the input of the inverter formed by transistors 412 and 405. Similarly, transistors 408 and 410 are configured as a pull-up stack to pull up node s 418 and drive the input of the inverter formed by transistors 411 and 404. The order of the transistors 307 and 309 in one of the pull-up stacks may be swapped without changing the function of the latch circuit 400.

When the clk 420 is low either transistors 407 and 403 are enabled or transistors 410 and 402 are enabled to drive the complement of input signal d 421 onto storage node sN 415 or to drive the input signal d 421 onto storage node s 418, respectively. Importantly, when the clock 420 is low the clock-enabled bridging transistor 401 is disabled and only one of the inverters formed by transistors 411 and 404 or transistors 412 and 405 has a pull-down path enabled. Consequently, the transistors driving the storage nodes sN 415 and s 418 do not need to overpower an opposing pull-down device and the storage nodes sN 415 and s 418 are easily written.

During the low phase of clk 420, the output signal Q 425 will follow the level of input signal d 421. When the clk 420 rises, the storage sub-circuit captures the level of input signal d 421 and holds the level to generate the output signal Q 425 during the high phase of the clk 420. During the high phase of the clk 420, the pull-up stacks within the propagation sub-circuit (transistors 408, 407, and 409 and transistors 408 and 410) have no effect on the output signal Q 425. Transistors 402 and 403 are included in the storage sub-circuit and in the propagation sub-circuit.

Figure 4B:
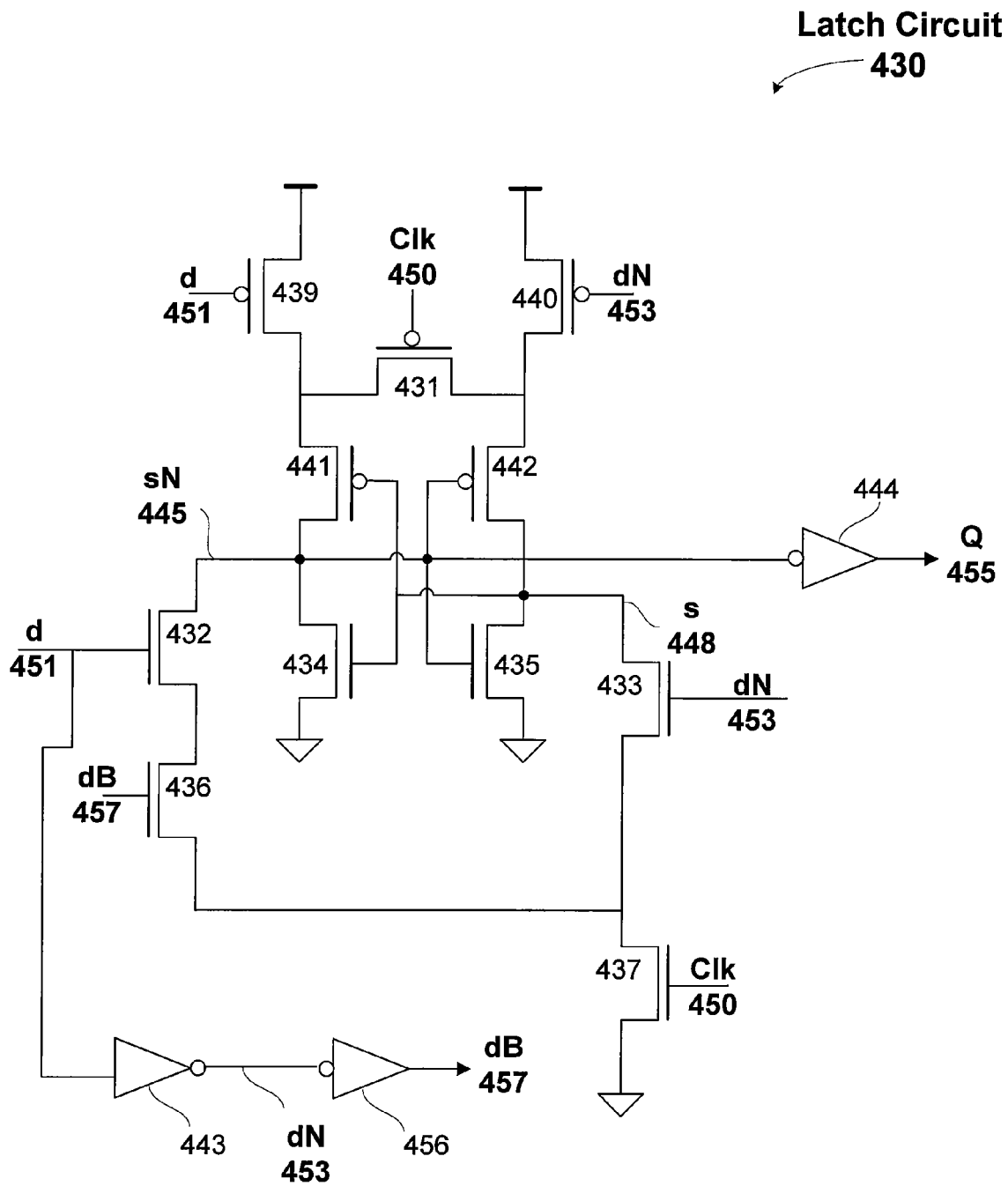
FIG. 4B illustrates another low-clock-energy latch circuit that is transparent when the clock signal is high, in accordance with one or more aspects of the present invention.

FIG. 4B illustrates a low-clock-energy latch circuit 450 that is transparent when the clock signal, Clk 450 is high, in accordance with one or more aspects of the present invention. The latch circuit 450 is an energy-efficient latch that presents only two loads to the clock and which does not depend on transistor device size ratios. With only two minimum sized clock loads, the latch circuit 450 should consume only a quarter of the clock energy that is consumed by a conventional pass-gate latch. The total number of transistors included in the latch circuit 450 is seventeen, where each of inverters 443, 444, and 456 include two transistors. Compared with the latch circuit 200 having sixteen transistors, the loads on the clock signal are reduced from four to two.

The latch circuit 430 is similar to the latch circuit 330 except that only a single enabled pull-down transistor 437 is used in the latch circuit 430. As previously described, a single enabled pull-down transistor may also be used in the latch circuit 330, but the operation would not necessarily be robust due to overlaps in signals d 351 and dN 353, causing both d 351 and dN 353 to be high during transitions of signal d 351. During these overlaps, s 348 and/or sN 345 may be inadvertently pulled low while the clk 350 is high. Careful sizing of the transistors in the latch circuit 330 is needed for reliable operation when only a single enabled pull-down transistor is used.

To avoid inadvertently pulling down s 448 and/or sN445 when d 451 transitions and the Clk 450 is high, the pull-down stack formed by transistors 432, 436, and 437 is activated when both d 451 and a delayed version of d 451, dB 457 are both high. The serial coupling of transistors 432 and 436 ensures robust operation while only burdening Clk 350 with two loads.

As shown in FIG. 4B transistors 432, 433, 434, 435, 436, and 437 are NMOS devices and transistors 431, 439, 440, 441, and 442 are PMOS devices. Transistors 434, 441, 435, and 442 are configured as cross-coupled inverters that are enabled by pull-up transistors 439 and 440 to form a storage sub-circuit. A first inverter includes transistors 441 and 434 and a second inverter includes transistors 442 and 435. The transistor 431 is an enabled bridging transistor that is configured to enable the storage sub-circuit when enable signal, Clk 450 is low, by allowing current to flow from the supply voltage through either transistor 439 or 440 when Clk 450 is low. The bridging transistor 431 is configured to enable a path between the storage sub-circuit and the supply voltage. Importantly, the connection to the supply voltage is provided by either transistor 439 or 440 because one (and only one) of transistors 439 and 440 is enabled at a time. The transistor 431 is shared between both inverters of the storage sub-circuit. Alternatively, the bridging transistor 431 may be configured as an always-on weak device (similar to transistor 331 as shown in FIG. 3D).

Transistors 432, 433, 436, 437, 439, 440, and inverters 443 and 456 that generate dN 453 and dB 457, respectively, form propagation circuitry that passes the input signal d 451 to the output signal Q 455. The inverter 444 isolates Q 455 from the storage feedback loop of the storage sub-circuit. In the event that setup timing is not critical, synchronization performance is not important, and the load on the output Q 455 is low and static, inverter 444 may be omitted.

The transistor 437 is enabled pull-down transistors that are configured to activate the propagation circuitry to pass the input signal d 451 through to the output signal Q 455 when the Clk 450 is high. Note that Clk 450 may be replaced with an enable signal. Transistor 431 is the opposite polarity compared with transistor 437 so that either the storage sub-circuit is enabled or the propagation circuitry is active, respectively, in order to produce a fully-static circuit. Transistors 432, 437, and 436 are configured as a pull-down stack to pull down node sN 445 and drive the input of the inverter formed by transistors 435 and 442. Similarly, transistors 433 and 437 are configured as a pull-down stack to pull down node s 448 and drive the input of the inverter formed by transistors 441 and 434. The order of the transistors 436 and 432 in one of the pull-up stacks may be swapped without changing the function of the latch circuit 430.

When the Clk 450 is high either transistors 436, 432, and 440 are enabled or transistors 439 and 433 are enabled to drive the complement of input signal d 451 onto storage node sN 445 or to drive the input signal d 451 onto storage node s 448, respectively. Importantly, when the Clk 450 is high the enabled bridging transistor 431 is disabled and only one of the inverters formed by transistors 441 and 434 or transistors 442 and 435 has a pull-up path enabled. Consequently, the transistors driving the storage nodes sN 445 and s 448 do not need to overpower an opposing pull-up device and the storage nodes sN 445 and s 448 are easily written.

During the high phase of Clk 450, the output signal Q 455 will follow the level of input signal d 451. When the Clk 450 falls, the storage sub-circuit captures the level of input signal d 451 and holds the level during the low phase of Clk 450 to generate the output signal Q 455. During the low phase of Clk 450, the pull-down stacks within the propagation sub-circuit (transistors 437, 432, and 436 and transistors 433 and 437) have no effect on the output signal Q 455. Transistors 439 and 440 are included in the storage sub-circuit and in the propagation sub-circuit.

Figure 4C:
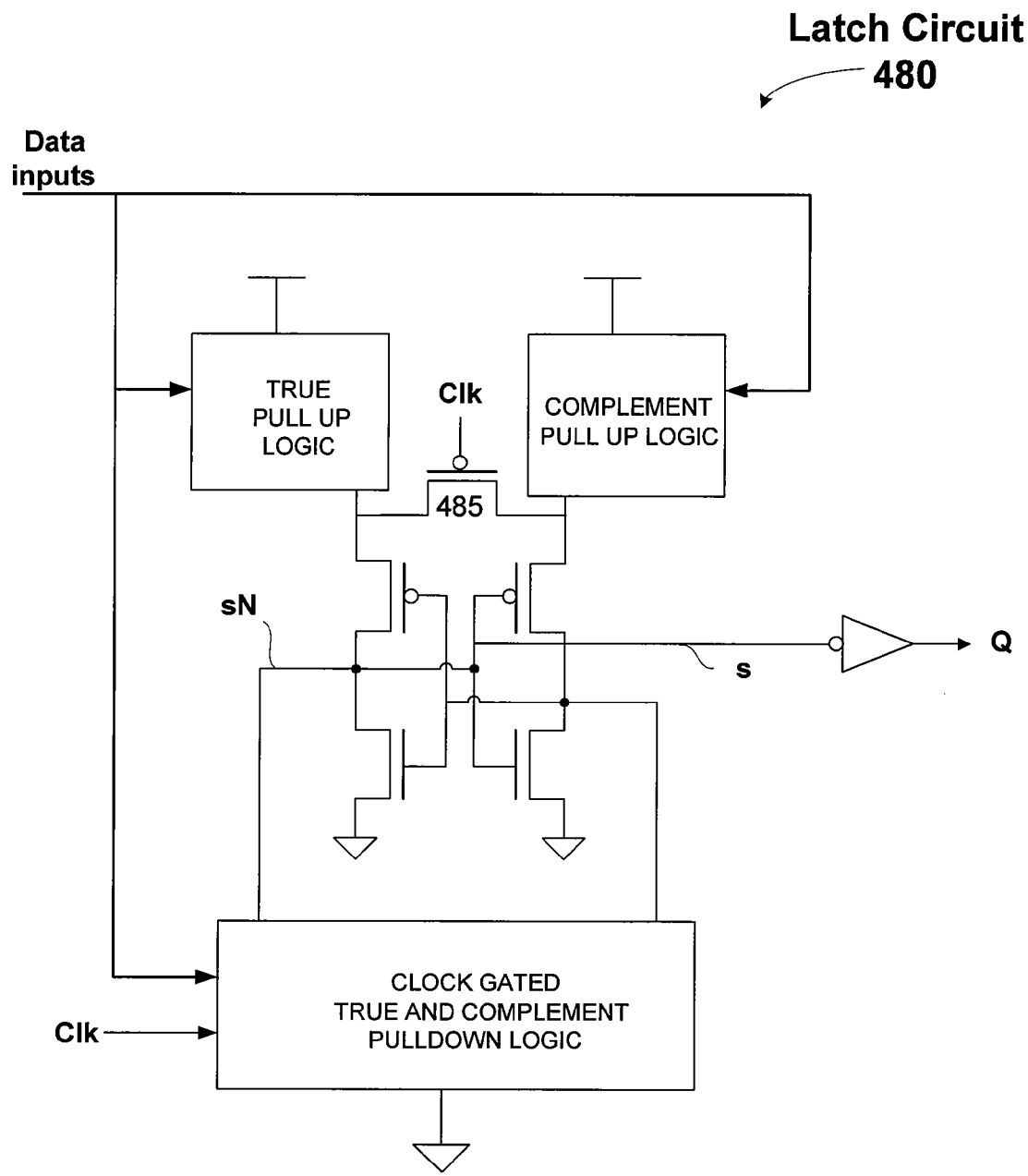
FIG. 4C illustrates a high-level diagram of the low-clock-energy latch circuits including the bridging transistor, in accordance with one or more aspects of the present invention.

FIG. 4C illustrates a high-level diagram of a low-clock-energy latch circuit 480 including the bridging transistor 485, in accordance with one or more aspects of the present invention. The low-clock-energy latch circuit 480 represents latch circuits 330 of FIG. 3B and 430 of FIG. 4B. A high-level diagram of a low-clock-energy latch circuit may also be used to represent the latch circuits 300 and 400 of FIGS. 3A and 4A, respectively. Combinational logic functions on multiple inputs can be embedded in low-clock-energy latch circuit 480 by modifying the pull up and clock gated pull down logic cones to implement true and complement dual representations of the embedded logic function. Also, the clock signal coupled to the gate of the bridging transistor may be replaced with the power supply (or ground in the case of the latch circuits 360).

Figure 5A:
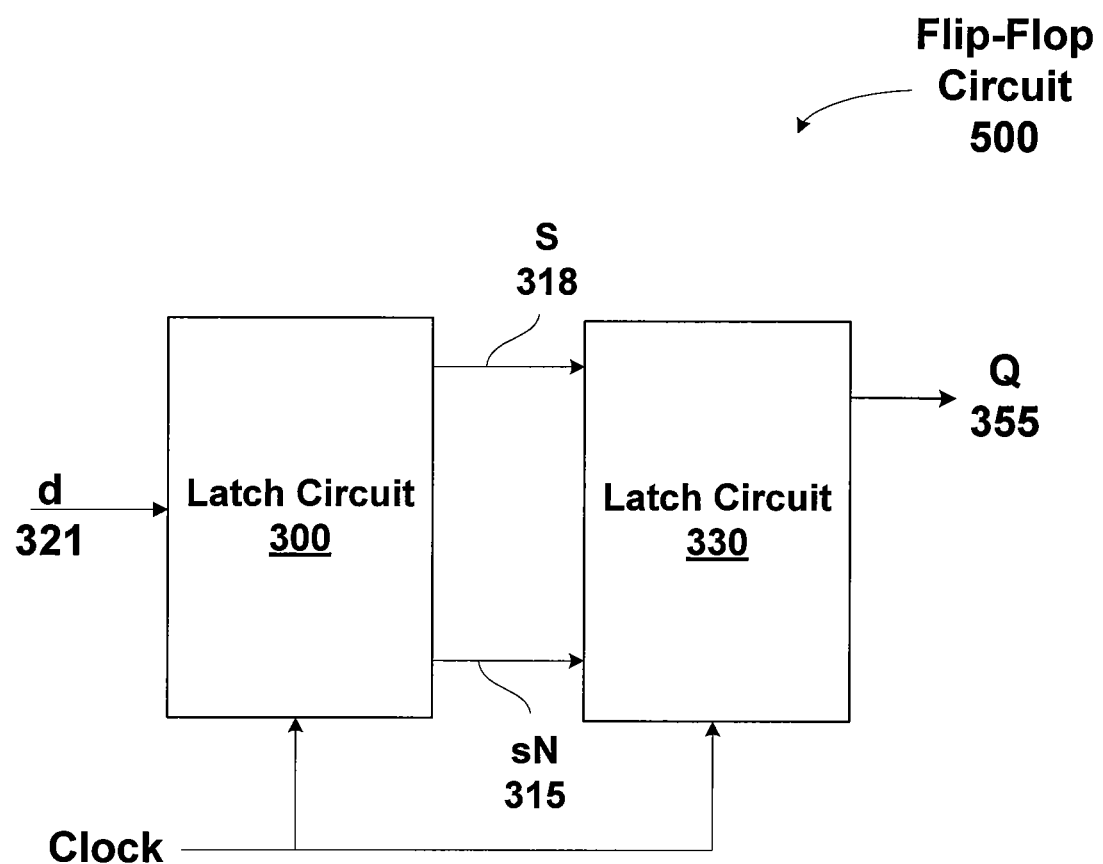
FIG. 5A is a block diagram illustrating a flip-flop constructed using the low-clock-energy latch circuits shown in FIGS. 3A and 3B, FIGS. 3C and 3D, or in FIGS. 4A and 4B, in accordance with one or more aspects of the present invention.

FIG. 5A is a block diagram illustrating a flip-flop circuit 500 constructed using the low-clock-energy latch circuits 300 and 330 shown in FIGS. 3A and 3B, in accordance with one or more aspects of the present invention. In an alternate embodiment, the flip-flop circuit 500 is constructed using the low-clock-energy latch circuits 360 and 380 shown in FIGS. 3C and 3D or low-clock energy latch circuits 400 and 430 shown in FIGS. 4A and 4B. A clock signal is input to the clk 320 input of the latch circuit 300 and the clk 350 of the latch circuit 330. Because latch 300 is transparent on clock low and latch 330 is transparent on clock high, a flip-flop can be realized without the need to invert the clock. The storage node s 318 from the latch circuit 300 is coupled to the input signal d 351 of the latch circuit 330 and the storage node sN 315 from the latch circuit 300 is coupled to the gate of transistors 333 and 340 of the latch circuit 330 (the inverter 343 may be omitted from the latch circuit 330). The inverter 314 may be omitted from the latch circuit 300.

Figure 5B:
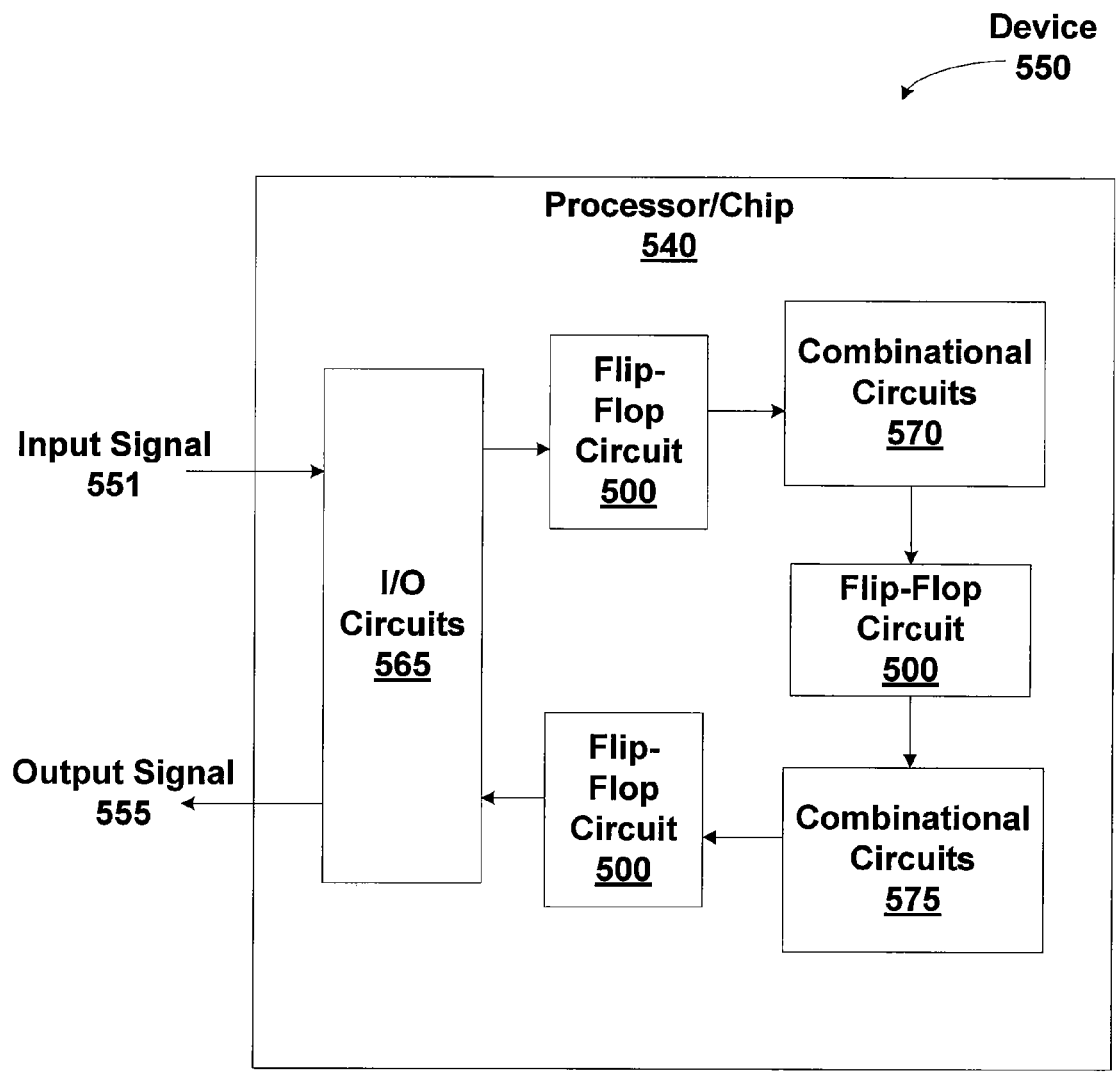
FIG. 5B is a block diagram illustrating a processor/chip including flip-flops from FIG. 4, in accordance with one or more aspects of the present invention.

FIG. 5 is a block diagram illustrating a processor/chip 540 including the flip-flop circuit 500 from FIG. 4, in accordance with one or more aspects of the present invention. I/O circuits 565 may include pads and other I/O specific circuits to send and receive signals from other devices in a system. Output signal 555 is produced by I/O circuits 565 based on signals received by the I/O circuits 565. The input signal 551 is received by the I/O circuits 565 and is input to the first flip-flop circuit 500 for storage. The I/O circuits 565 also provide clock signals to the flip-flop circuits 500. The combinational circuits 570 receive the output generated by the first flip flop circuit 500 and generate a combinational output that is received by the second flip-flop circuit 500. The second flip-flop circuit 500 stores the combinational output and generates an output that is input to the combinational circuits 572. The output of the combinational circuits 572 is received and stored by the third flip-flop circuit 500. The third flip-flop circuit 500 generates an output that is provided to the I/O circuits 565. The flip-flop circuits 500 may be used to store signals for multiple clock cycles or to pipeline signals that change as frequently as each clock cycle. Multiple flip-flop circuits 500 may also be used in an array to form a register file.

System Overview

Figure 6:
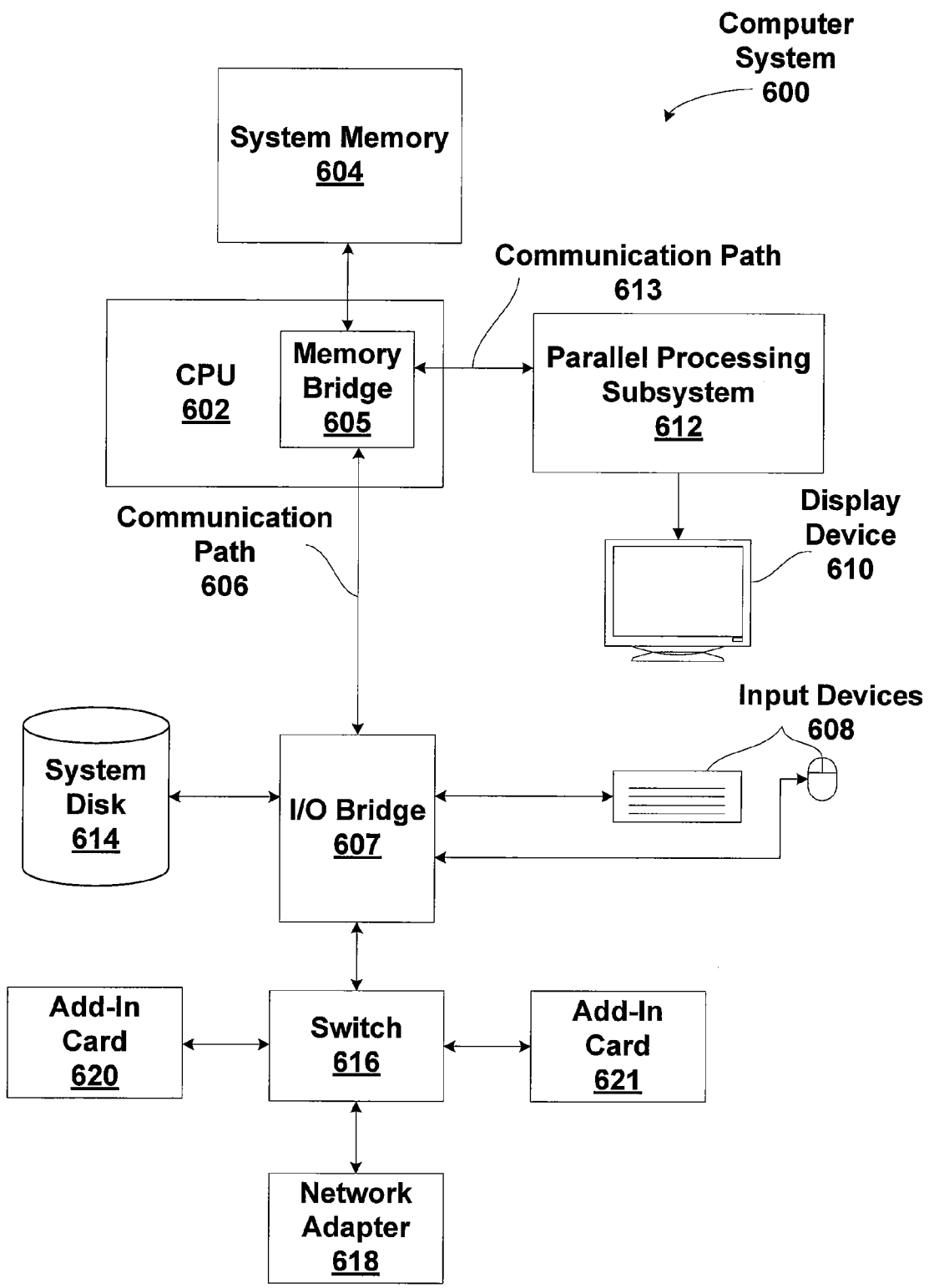
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include a low-clock-energy latch circuit 300, 330, 350, or 380 or a low-clock-energy flip-flop circuit 500.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, the low-clock-energy latch circuit 300 or 330 reduces the transistor device load to only four transistor gates and is fully static. The low-clock-energy latch circuit 350 or 380 reduces the transistor device load to only three transistor gates. The clock energy is reduced significantly compared with latch circuit having greater loads on the clock signal and does not rely on sizing relationships between the different transistors to function properly. Therefore, the latch circuit operation is robust, even when the characteristics of the transistors vary due to the fabrication process.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A latch circuit comprising:
 a storage sub-circuit including two cross-coupled inverters and configured to capture a level of an input signal at a falling transition of a clock signal from high to low and hold the captured level of the input signal to generate an output signal that equals the captured level of the input signal while the clock signal is low and until a rising transition of the clock signal from low to high, wherein the inverters each have a power supply terminal coupled to a power supply;
 a bridging transistor coupled between the power supply terminals and configured to receive the clock signal to turn on or off the bridging transistor and allow current to flow from the power supply to the storage sub-circuit; and
 a propagation sub-circuit configured to receive the input signal and propagate the input signal to generate the output signal so that the input signal is passed through to the output signal beginning at the rising transition of the clock signal from low to high, continuing while the clock signal is high, and ending at the falling transition of the clock signal from high to low, wherein at least one pull-down transistor activates the propagation sub-circuit when the clock signal is high and deactivates the propagation sub-circuit when the clock signal is low.

2. The latch circuit of claim 1, wherein the propagation sub-circuit comprises:
 a first input transistor having a gate that is directly coupled to the input signal and is coupled to a first pull-down transistor of the at least one pull-down transistor; and
 a second input transistor that receives an inverted input signal and is coupled to a second pull-down transistor of the at least one pull-down transistor.

3. The latch circuit of claim 1, wherein operation of the storage sub-circuit and the propagation sub-circuit does not depend on sizing relationships between transistors.

4. The latch circuit of claim 1, wherein the storage sub-circuit comprises a pull-up transistor with a gate coupled to the input signal and a complement pull-up transistor with a gate coupled to an inverted input signal and the bridging transistor is coupled between a drain of the pull-up transistor and a drain of the complement pull-up transistor to allow current to flow from the power supply to the storage sub-circuit.

5. The latch circuit of claim 1, further comprising a pull-up transistor having a source directly coupled to the power supply, a gate coupled to the input signal, and a drain coupled to the bridging transistor and the storage sub-circuit.

6. The latch circuit of claim 1, further comprising a pull-up transistor having a source directly coupled to the power supply, a gate coupled to an inverted input signal, and a drain coupled to the bridging transistor and the storage sub-circuit.

7. The latch circuit of claim 1, wherein the bridging transistor is a PMOS device.

8. The latch circuit of claim 1, wherein the propagation sub-circuit comprises a pull-down logic cone with a gate coupled to at least the input signal and a complement pull-down logic cone with a gate coupled to at least an inverted input signal and at least one clock-enabled transistor to deactivate the propagation sub-circuit when the dock signal is low.

9. The latch circuit of claim 4, wherein the gate of the pull-up transistor is directly coupled to the input signal and the pull-up transistor is a PMOS device.

10. The latch circuit of claim 5, wherein the gate of the pull-up transistor is directly coupled to the input signal and the pull-up transistor is a PMOS device.

11. The latch circuit of claim 6, wherein the gate of the pull-up transistor is directly coupled to the inverted input signal and the pull-up transistor is a PMOS device.

12. The latch circuit of claim 1, wherein the clock signal is coupled to only three minimum sized loads presented by transistor gates.

* * * * *